(12) United States Patent  
Yamano et al.

(10) Patent No.: US 7,994,431 B2
(45) Date of Patent: Aug. 9, 2011

(54) SUBSTRATE WITH BUILT-IN ELECTRONIC COMPONENT AND METHOD FOR MANUFACTURING THE SAME

(75) Inventors: Takaharu Yamano, Nagano (JP); Yoshihiro Machida, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 960 days.

(21) Appl. No.: 11/907,179

(22) Filed: Oct. 10, 2007

(65) Prior Publication Data

US 2008/0089048 A1   Apr. 17, 2008

(30) Foreign Application Priority Data

Oct. 11, 2006   (JP) .............................. P.2006-277896

(51) Int. Cl.
*H05K 1/16* (2006.01)

(52) U.S. Cl. ........................................ 174/260; 174/262

(58) Field of Classification Search .................. 174/260, 174/261, 262
See application file for complete search history.

(56) References Cited

U.S. PATENT DOCUMENTS 6,734,542 B2 * 5/2004 Nakatani et al. .............. 257/687
6,855,892 B2 * 2/2005 Komatsu et al. .............. 174/256

FOREIGN PATENT DOCUMENTS

JP   2006-195918   7/2006

* cited by examiner

*Primary Examiner* — Ishwarbhai B Patel
(74) *Attorney, Agent, or Firm* — Drinker Biddle & Reath LLP

(57) ABSTRACT

A substrate with built-in electronic components includes a substrate on which a first conductive pattern is formed; an electronic component mounted on the substrate; an insulting layer which is formed by stacking a plurality of resin layers including indifferent additive ratios an additive material for adjusting hardness; a second conductive pattern formed on the insulating layer; and a conductive post for connecting the first conductive pattern to the second conductive pattern.

8 Claims, 16 Drawing Sheets

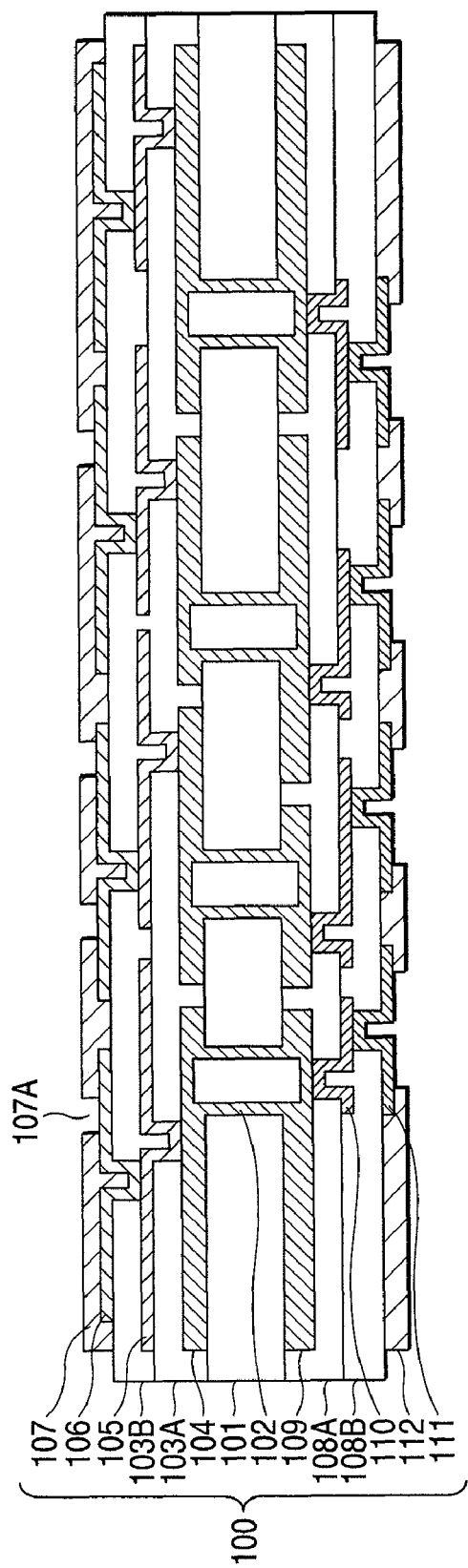

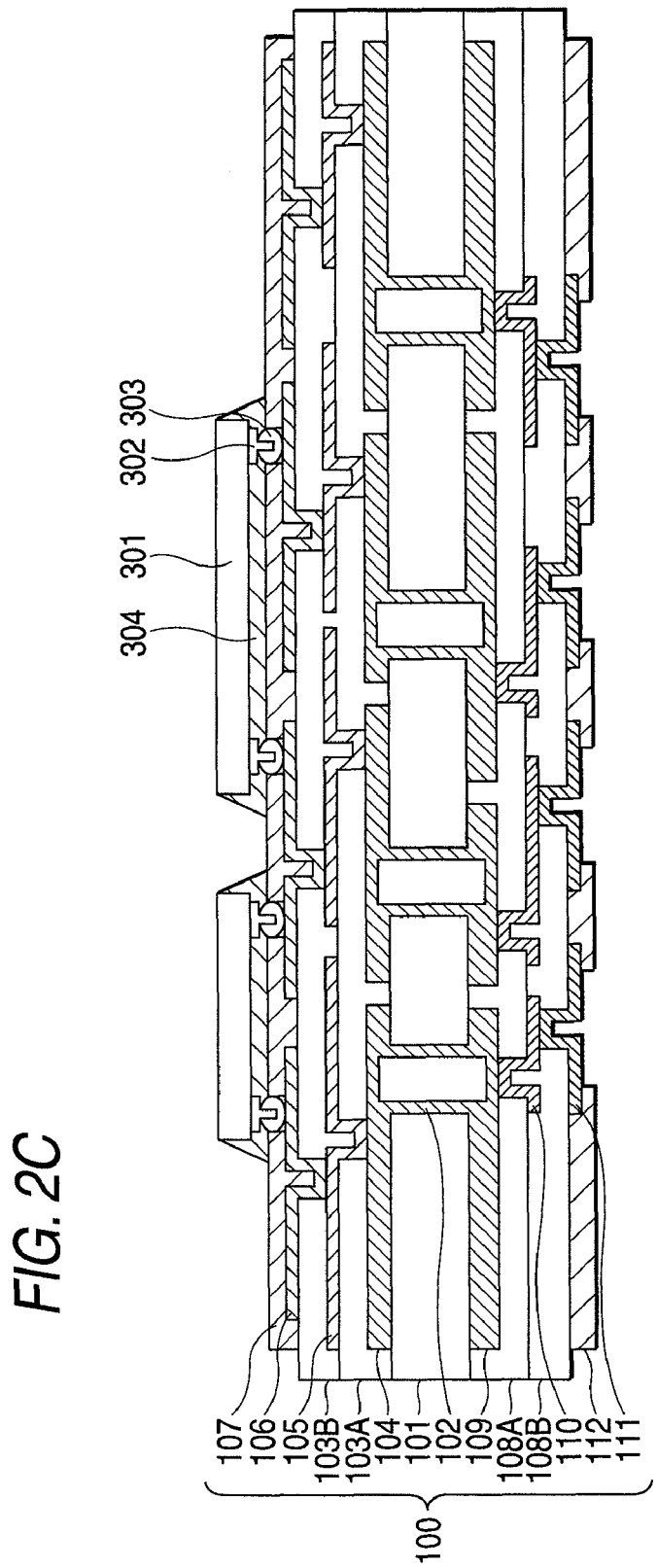

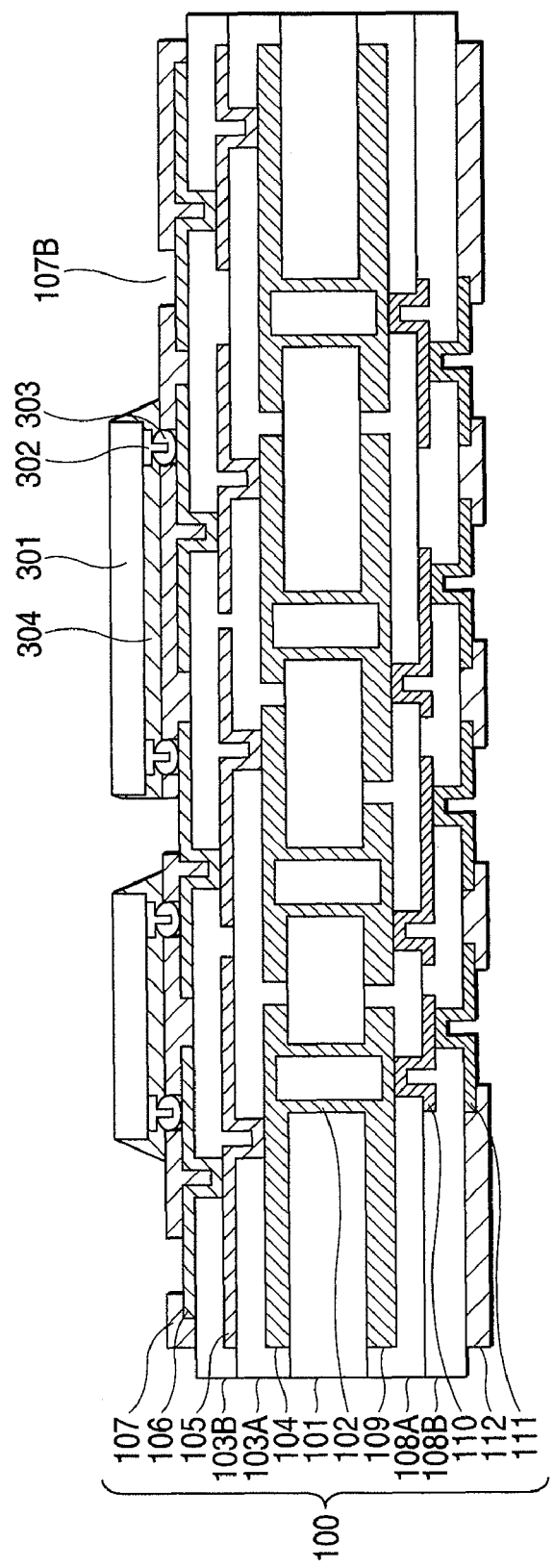

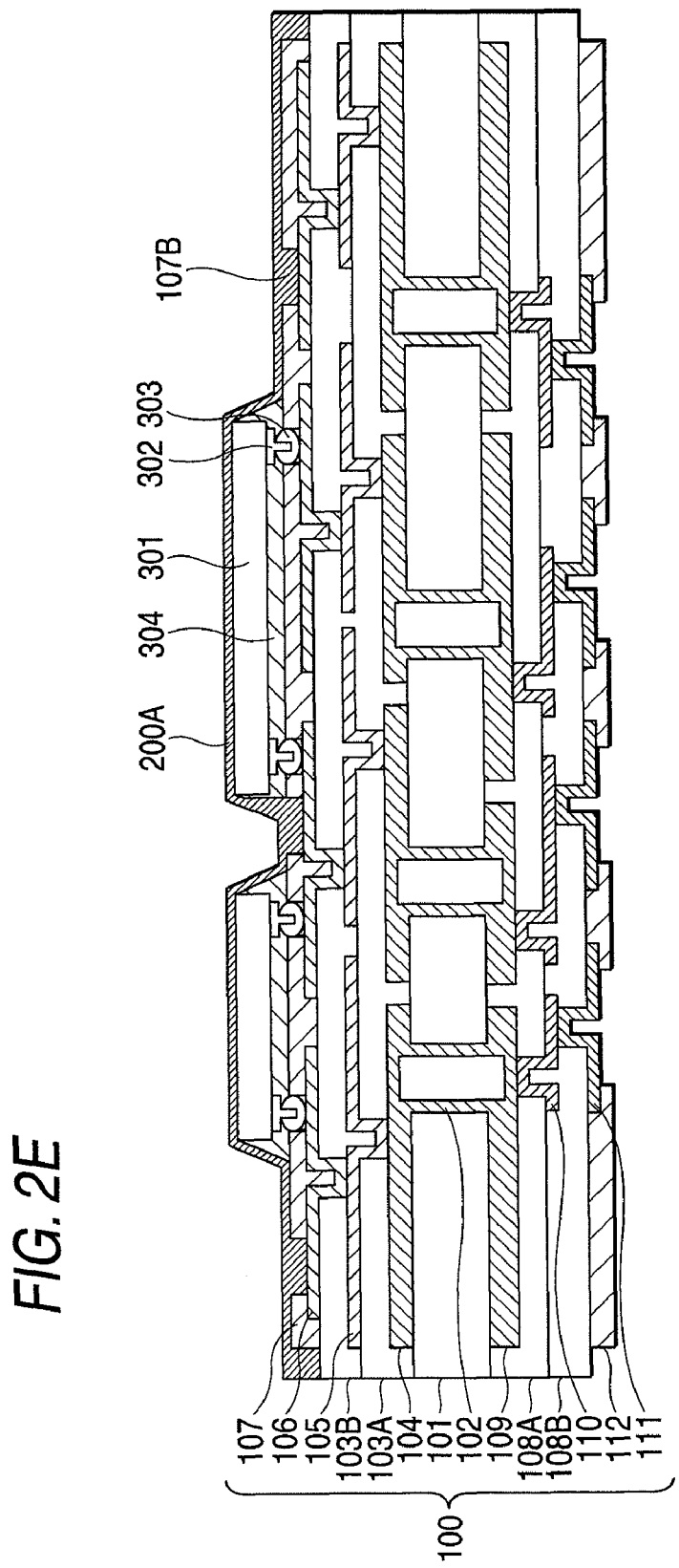

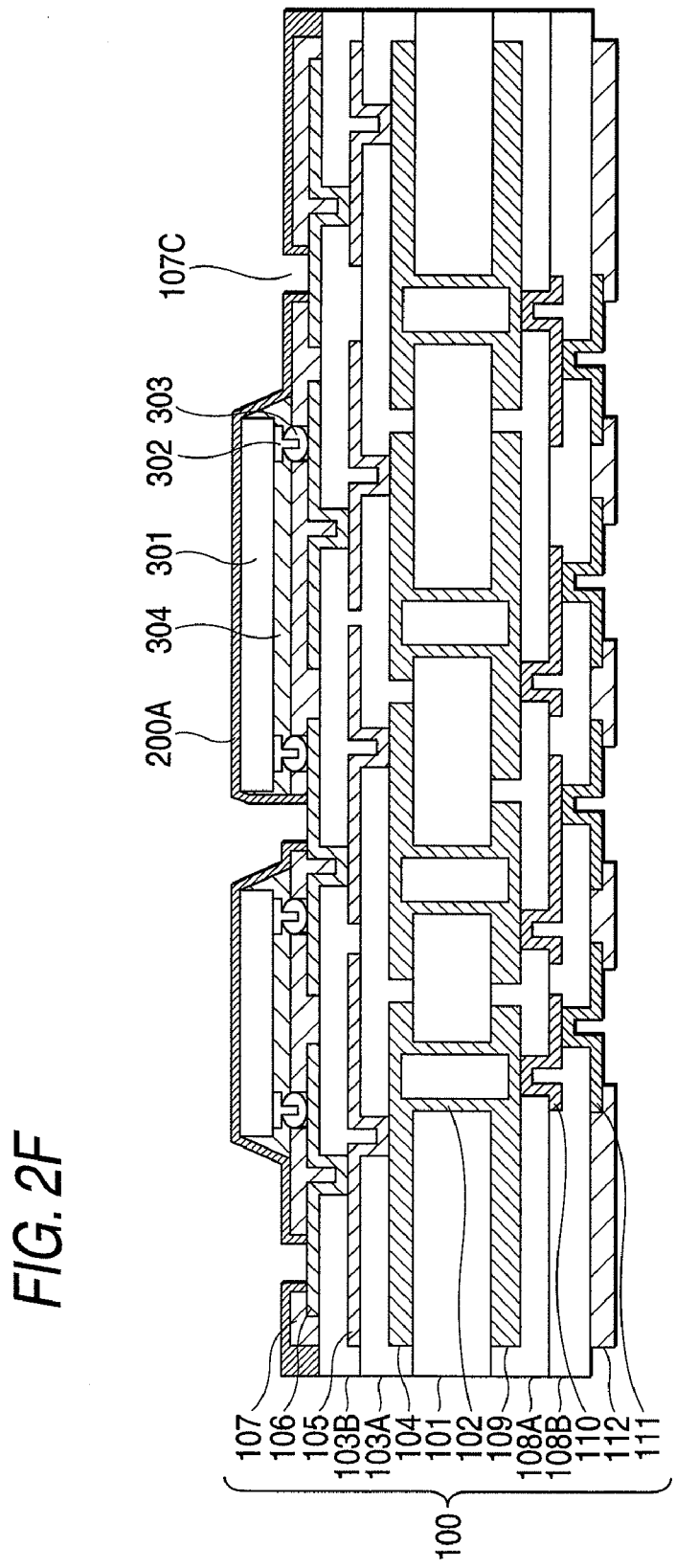

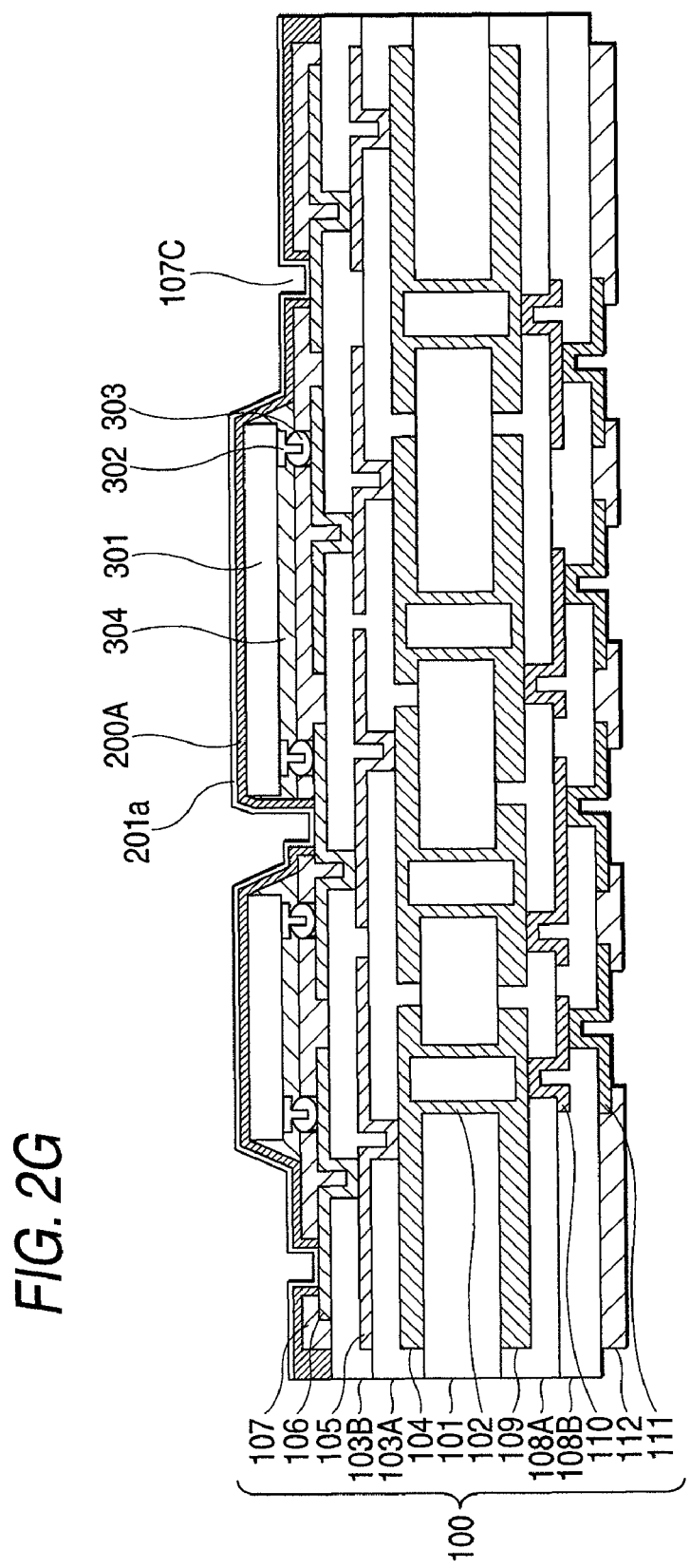

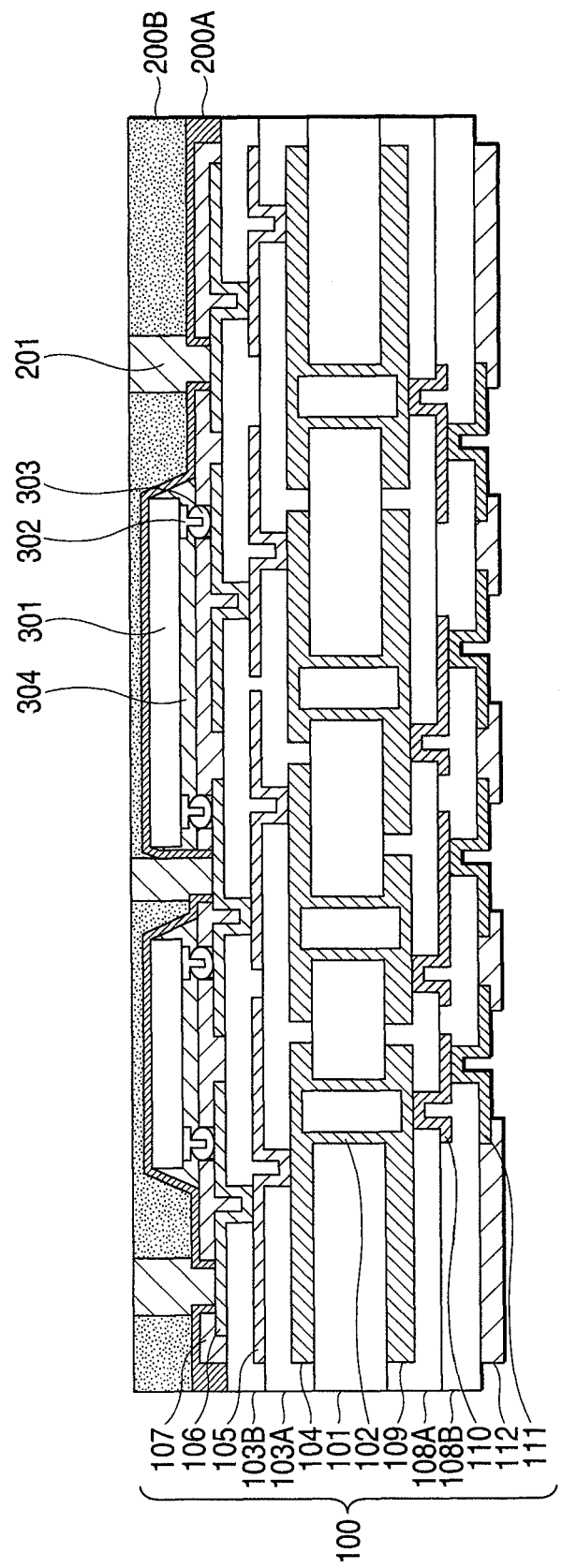

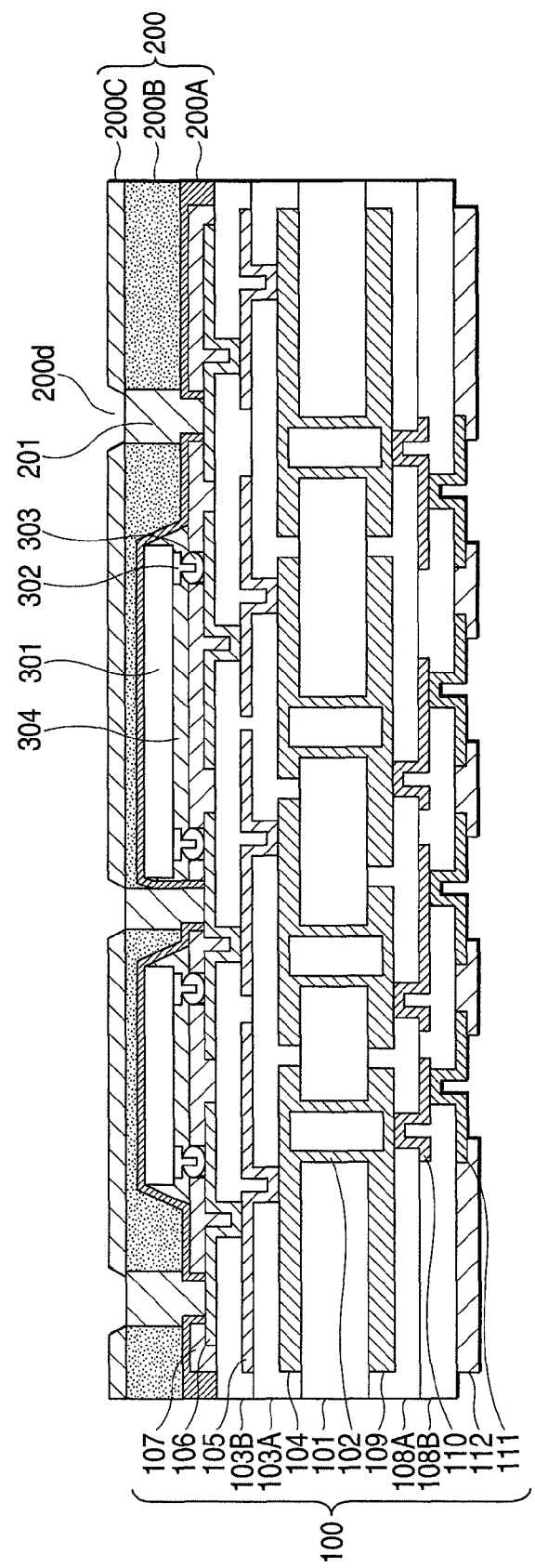

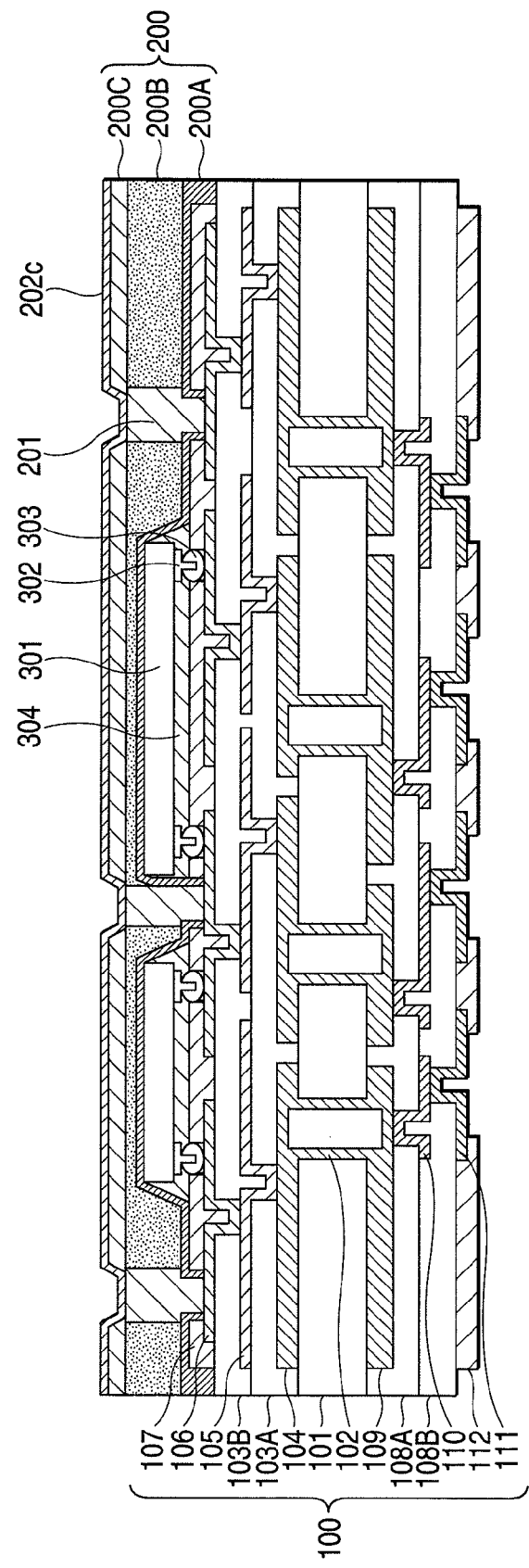

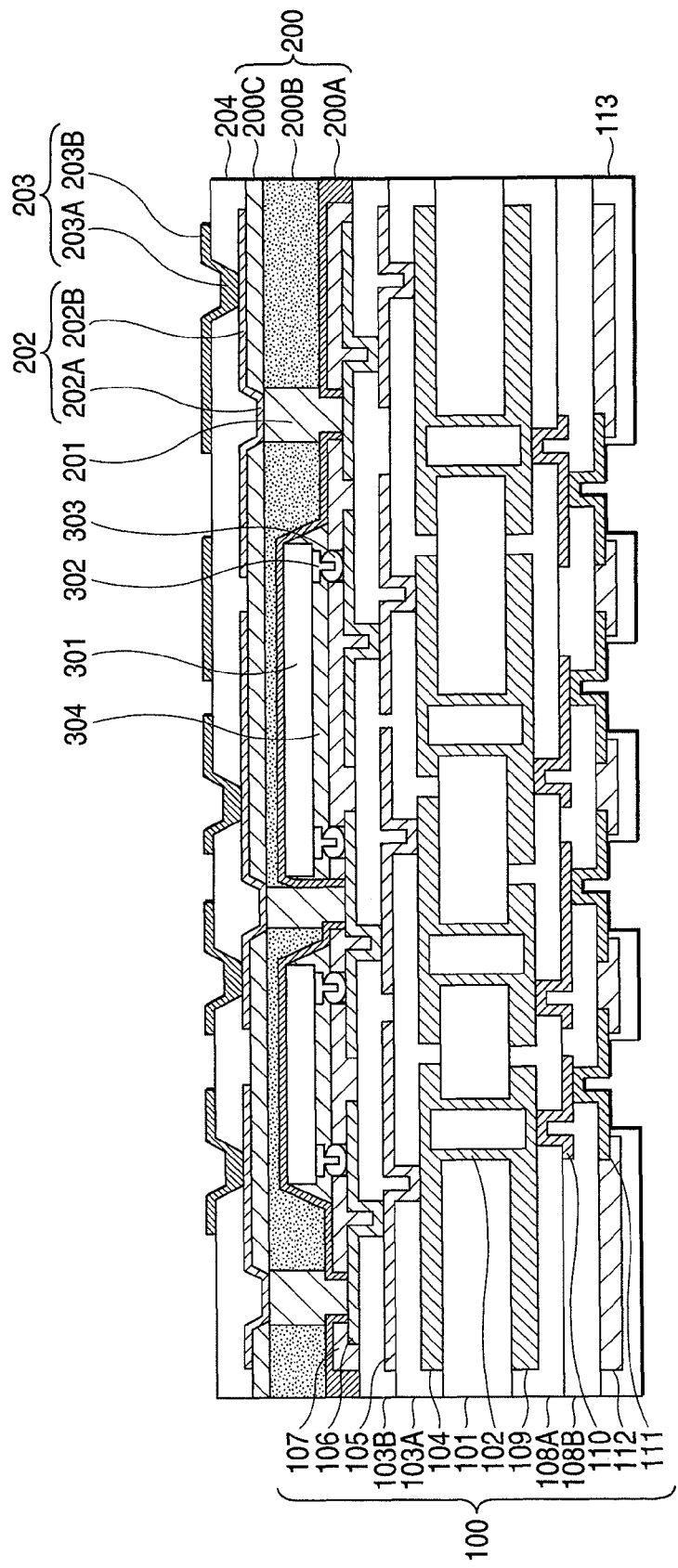

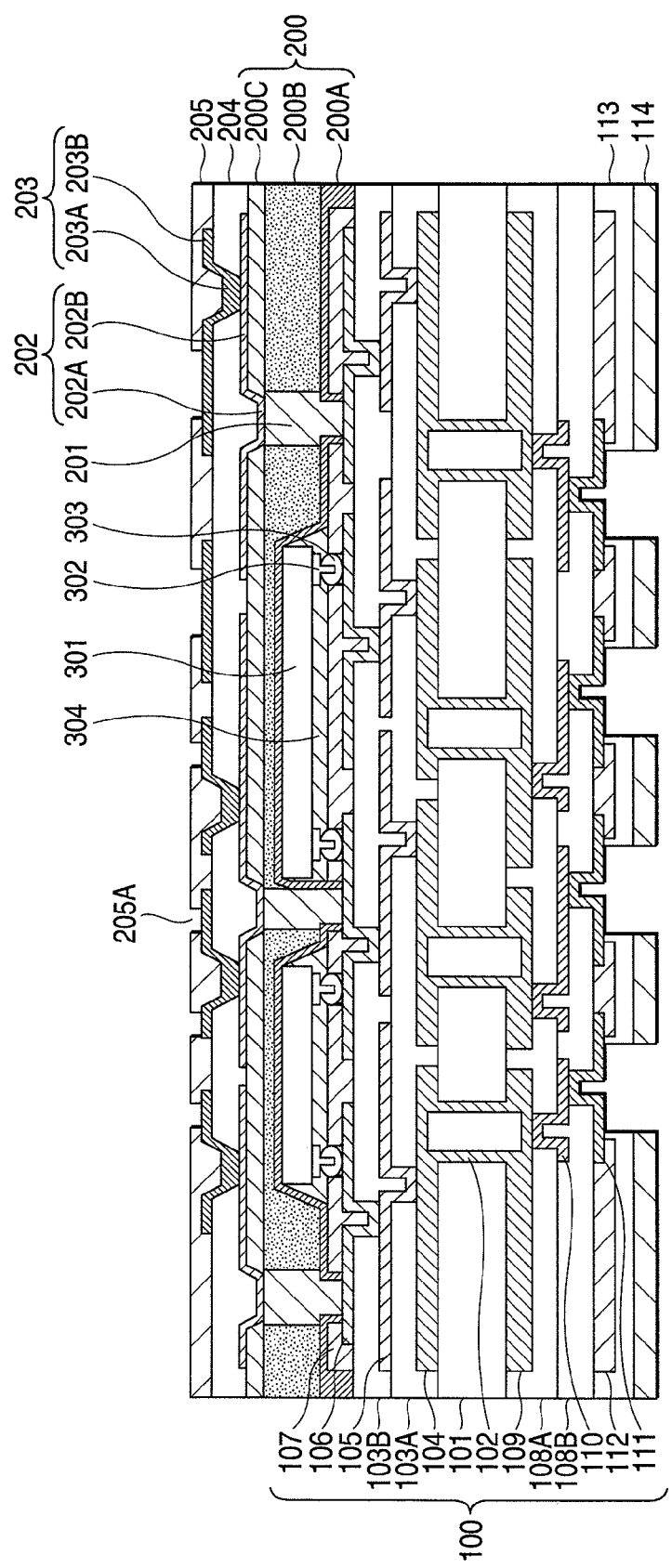

SUBSTRATE WITH BUILT-IN ELECTRONIC COMPONENT AND METHOD FOR MANUFACTURING THE SAME

This application claims priority to Japanese Patent Application No. 2006-277896, filed Oct. 11, 2006, in the Japanese Patent Office. The priority application is incorporated by reference in its entirety.

TECHNICAL FIELD

The present disclosure relates to a substrate with a built-in electronic component which incorporates a semiconductor chip or a passive element, such as capacitor, resistor, and inductor (hereinafter simply called an "electronic component built-in substrate"), as well as to a method for manufacturing the substrate with a built-in electronic component.

RELATED ART

For instance, various structures have already been put forward in connection with a so-called electronic component built-in substrate, which incorporates an electronic component; e.g., a semiconductor chip. For example, a resin material, such as an epoxy-based resin material or a polyimide-based resin material, is commonly used as a material for an insulating layer in which the electronic component (semiconductor chip) is to be embedded.

For example, the electronic component built-in substrate schematically has a structure in which an electronic component mounted on a substrate, over which a conductive pattern is formed, is embedded in an insulating layer formed from a resin material and in which a conductive pattern, such as electrode pad and wiring, is formed on the insulating layer.

The conductive pattern formed on the substrate which is to serve as a lower layer for the electronic component and the conductive pattern formed on the insulating layer which is to serve as an upper layer for the electronic component are connected together by means of a predetermined conductive material formed in the insulating layer.

[Patent Document 1] Japanese Patent Unexamined Publication No. 2006-195918

However, in the above electronic component built-in substrate, the insulating layer where the electronic component is to be embedded must be formed thick. Therefore, it may be the case where a problem of a decrease in the reliability of the electronic component built-in substrate arises.

For instance, when a thick insulating layer for use in embedding an electronic component is formed only on one side of a substrate on which the electronic component is to be mounted, stress acting on the substrate become unbalanced between the front side and the rear side of the substrate, thereby resulting in warpage of the substrate. Thus, a problem arises in a conductive pattern formed on the substrate or a conductive pattern formed on an insulating layer, which may in turn result in a decrease in the reliability of the electronic component built-in substrate Some of electronic components generate heat because of operation, as in the case of a semiconductor chip. Hence, a heat cycle arises in an insulating layer where such an electronic component is embedded. When the insulating layer iterates expansion and contraction because of such a heat cycle, a problem arises in a conductive pattern formed on the substrate or a conductive pattern formed on an insulating layer, which may in turn result in a decrease in the reliability of the electronic component built-in substrate.

SUMMARY

Exemplary embodiments of the present invention provide a substrate with a built-in electronic component and a method for manufacturing the substrate with a built-in electronic component.

Exemplary embodiments of the present invention provide a substrate with a built-in electronic component, which has superior reliability and in which the electronic component is embedded in an insulating layer, as well as a method for manufacturing the substrate with a built-in electronic component.

According to a first aspect of the present invention, a substrate with a built-in electronic component, comprises:
a substrate on which a first conductive pattern is formed;
an electronic component mounted on the substrate;
an insulting layer formed by stacking a plurality of resin layers including additive material in different additive ratios;
a second conductive pattern formed on the insulating layer; and
a conductive columnar electrode for connecting the first conductive pattern to the second conductive pattern.

According to the present invention, the reliability of the substrate with a built-in electronic component formed by means of embedding the electronic component in the insulating layer can be enhanced.

According to a second aspect of the present invention, a method for manufacturing a substrate with a built-in electronic component, comprises:
a first process of mounting an electronic component on a substrate on which a first conductive pattern is formed;
a second process of forming an insulting layer from a plurality of resin layers including additive material in different additive ratios, and forming a conductive columnar electrode to be connected to the first conductive pattern; and
a third process of forming, on the insulating layer, a second conductive pattern to be connected to the columnar electrode.

According to the present invention, the substrate with a built-in electronic component, which exhibits superior reliability and in which the electronic component is embedded in the insulating layer, can be manufactured.

The present invention can provide a substrate with a built-in electronic component, which has superior reliability and in which an electronic component is embedded in an insulating layer, as well as a method for manufacturing the substrate with a built-in electronic component.

Other features and advantages may be apparent from the following detailed description, the accompanying drawings and the claims.

BRIEF DESCRIPTION OF THE DRAWINGS

FIG. 2A is a view showing a method for manufacturing the substrate with built-in electronic components of the first embodiment (part 1);

FIG. 2C is a view showing a method for manufacturing the substrate with built-in electronic components of the first embodiment (part 3);

FIG. 2D is a view showing a method for manufacturing the substrate with built-in electronic components of the first embodiment (part 4);

FIG. 2E is a view showing a method for manufacturing the substrate with built-in electronic components of the first embodiment (part 5);

FIG. 2F is a view showing a method for manufacturing the substrate with built-in electronic components of the first embodiment (part 6);

FIG. 2G is a view showing a method for manufacturing the substrate with built-in electronic components of the first embodiment (part 7);

FIG. 2I is a view showing a method for manufacturing the substrate with built-in electronic components of the first embodiment (part 9);

FIG. 2J is a view showing a method for manufacturing the substrate with built-in electronic components of the first embodiment (part 10);

FIG. 2K is a view showing a method for manufacturing the substrate with built-in electronic components of the first embodiment (part 11);

FIG. 2L is a view showing a method for manufacturing the substrate with built-in electronic components of the first embodiment (part 12);

FIG. 2N is a view showing a method for manufacturing the substrate with built-in electronic components of the first embodiment (part 14); and FIG. 2O is a view showing a method for manufacturing the substrate with built-in electronic components of the first embodiment (part 15).

DETAILED DESCRIPTION

Figure 1:
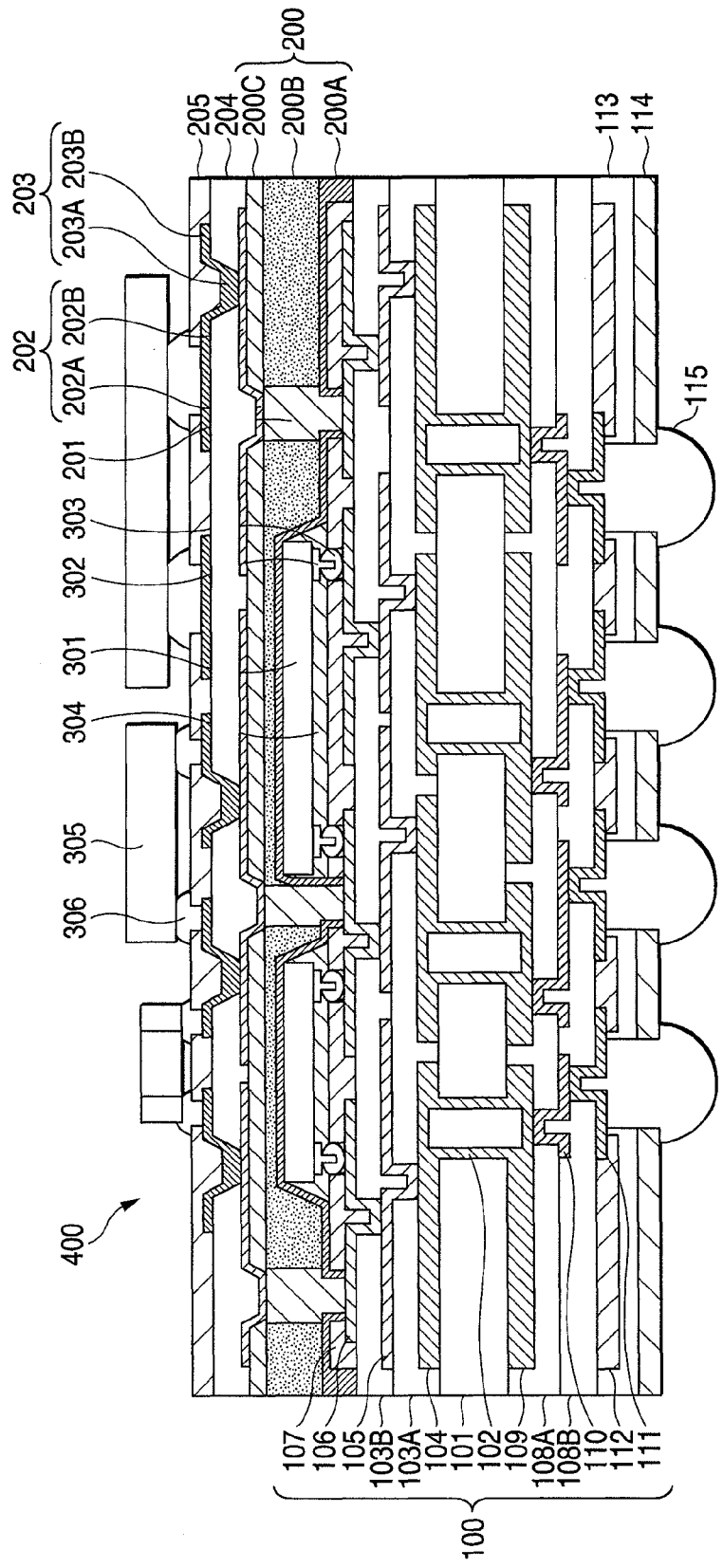
FIG. 1 is a view showing a substrate with built-in electronic components of a first embodiment of the present invention.

A substrate with a built-in electronic component (hereinafter simply called an "electronic component built-in substrate") of the present invention has a substrate on which a first conductive pattern is formed; an electronic component mounted on the substrate; an insulating layer formed by stacking a plurality of resin layers including additive material for adjusting hardness in different additive ratios and where the electronic component is embedded; a second conductive pattern formed on the insulating layer; and conductive columnar electrode for connecting the first conductive pattern to the second conductive pattern.

Specifically, the above-described electronic component built-in substrate is characterized in that the insulating layer where the electronic component is to be embedded is formed by stacking a plurality of resin layers including additive material for adjusting hardness in different additive ratios. Thus, as a result of stacking of a plurality of resin layers including additive material in different additive ratios rather than a mere increase in the amount of an additive material added to the resin layer, warpage and expansion/contraction of the insulating layer are prevented, to thus enhance the reliability of the electronic component built-in substrate. Further, there is yielded an advantage of formation of conductive pattern and conductive columnar electrode being facilitated as described below.

For instance, an additive material called a filler is typical as an additive material for use in controlling the hardness of a resin layer. The filler is generally formed from particles which contain $SiO_2$ called silica as a principal ingredient. The hardness of resin; for example, a modulus of longitudinal elasticity (hereinafter called an "elastic modulus" in the following descriptions) or a coefficient of thermal expansion is adjusted according to the additive ratio of a filler in the resin.

A method for making a resin layer hard by means of increasing the additive ratio of an additive material, such as a filler, is available to prevent warpage or deformation of the resin layer. However, when the additive ratio of a filler content is increased, the elastic modulus of a resin layer becomes greater, and the coefficient of thermal expansion becomes smaller.

However, when the additive ratio of the additive material in the resin layer has become excessively great, warpage or deformation is prevented, but it may also be the case where the additive material poses a problem on formation of a conductive pattern or a conductive columnar electrode. For instance, when the additive ratio of an additive material in a resin layer has become excessively large, difficulty is encountered in subjecting the resin layer to electroless plating. Therefore, a semi-additive method using electroless plating raises a problem of difficulty being encountered in forming a conductive pattern or a conductive columnar electrode.

The semi-additive method is a method for forming a seed layer by means of: for example, an electroless plating method, and subsequently forming a conductive pattern or a conductive columnar electrode on the seed layer by means of electrolytic plating while the seed layer is taken as a feeding layer. In order to perform patterning of a conductive pattern, the essential requirement is to form a resist pattern on a seed layer and perform electrolytic plating.

For instance, when the seed layer is formed, use of a sputtering technique is also possible. Since the sputtering technique requires a processing container for internally generating a reduced pressure or an expensive apparatus having plasma generation means, which in turn adds to the cost for manufacturing an electronic component built-in substrate. Thus, this method is not realistic.

Accordingly, in the present invention, an insulating layer into which an electronic component is to be embedded is formed by stacking a plurality of resin layers including additive material for adjusting hardness in different additive ratios. Therefore, for instance, the insulating layer can be formed into a multilayer structure consisting of a hard resin layer including a large additive ratio of the additive material and a resin layer which enables electroless plating and which includes a small additive ratio of the additive material.

First, for instance, a first resin layer including a small additive ratio of an additive material is thinly formed on a first conductive pattern, thereby enabling formation of the conductive columnar electrode on the first resin layer by means of the semi-additive method. The columnar electrode is for connecting a lower conductive pattern (the first conductive pattern) of the electronic component to an upper conductive pattern (a second conductive pattern) of the electronic component.

Thickly forming, on the first resin layer, a second resin layer, into which the columnar electrode is to be embedded and which has a large additive ratio of the additive material, enables prevention of warpage or deformation of the insulating layer.

Thinly forming a third resin layer including a small additive ratio of the additive material on the second resin layer (at the second conductive pattern side) enables formation of the second conductive pattern connected to the columnar electrode on this third resin layer by means of the semi-additive method.

The additive material is not limited to a filter. For instance, glass cloth fibers (containing $SiO_2$ as the principal ingredient) may also be used.

The configuration of the electronic component built-in substrate and an example method for manufacturing the same will be described hereunder by reference to the drawings.

FIRST EMBODIMENT

FIG. 1 is a cross-sectional view diagrammatically showing a substrate with built-in electronic components (hereinafter called an "electronic component built-in substrate") of a first embodiment of the present invention. By reference to FIG. 1, an electronic component built-in substrate 400 of the present invention broadly has a structure in which a plurality of electronic components (e.g., semiconductor chips) 301 are mounted on a wiring board 100 and in which the electronic components 301 are embedded in an insulating layer 200.

Further, in this structure, a conductive pattern 106 (a first conductive pattern), which is formed in the wiring board 100 and beneath the insulating layer 200, and a conductive pattern 202 (a second conductive pattern) formed on the insulating layer 200 are electrically connected by means of posts (columnar electrode) 201 formed from a conductive material in the insulating layer 200. Moreover, a plurality of electronic components 305 are mounted on the conductive pattern 202 (in a layer above the insulating layer 200).

In the above configuration, the wiring board 100 is first considered. The wiring board 100 has a structure in which a multilayer wiring is formed on both sides of a core substrate 101. A conductive pattern 109 which is to be connected to via plugs 102 penetrating through the core substrate 101 is formed on a back of the core substrate 101 (a side opposite to a side where electronic components are mounted).

Moreover, an insulating layer 108A is formed so as to cover the conductive pattern 109. A conductive pattern 110 connected to the conductive pattern 109 is formed such that portions (via plugs) of the pattern 110 are covered with the insulating layer 108A and such that other portions (a patterned wiring) of the pattern 110 become exposed through the insulating layer 108A.

Likewise, an insulating layer 108B is formed so as to cover the conductive pattern 110 exposed through the insulating layer 108A. A conductive pattern 111 connected to the conductive pattern 110 is formed such that portions (via plugs) of the pattern 111 are covered with the insulating layer 108B and such that other portions (a patterned wiring) of the pattern 111 become exposed through the insulating layer 108B.

A solder resist layer 112, an insulating layer 113, and a solder resist layer 114, all of which have opening sections, are stacked in sequence on the insulating layer 108, and solder bumps 115 are formed on the conductive pattern 111 exposed through the opening sections. As a result of formation of the solder bumps 115, connection of the electronic component built-in substrate 400 to a target to be connected, such as a mother board, has become easy.

A conductive pattern 104 to be connected to the via plugs 102 is formed on a front side of the core substrate 101 (the side on which electronic components are to be mounted).

Moreover, an insulating layer 103A is formed so as to cover the conductive pattern 104. A conductive pattern 105 to be connected to the conductive pattern 104 is formed such that portions (via plugs) of the pattern 105 are covered with the insulating layer 103A and such that other portions (a patterned wiring) of the pattern 105 become exposed through the insulating layer 103A.

Likewise, an insulating layer 103B is formed so as to cover the conductive pattern 105 exposed through the insulating layer 103A. A conductive pattern 106 connected to the conductive pattern 105 is formed such that portions (via plugs) of the pattern 106 are covered with the insulating layer 103B and such that other portions (a patterned wiring) of the pattern 106 become exposed through the insulating layer 103B.

Further, a solder resist layer 107 having a plurality of opening sections is stacked on the insulating layer 103. The posts 201 formed from a conductive material and electronic components 301 are connected to the conductive pattern 106 exposed through the opening sections. In this case, the electronic components 301 are connected to the conductive pattern 106 via bumps 302 and a solder layer 303 by flip-chip bonding. An underfill 304 is filled between the electronic components 301 and the solder resist layer 107.

The electronic components 301 and the posts 201 are embedded in the insulating layer 200. Moreover, the conductive pattern 202 connected to the posts 201 is formed such that a portion of the conductive pattern 202 is embedded in the insulating layer 200 and such that another portion of the same is exposed on the insulating layer 200. Specifically, the conductive pattern 202 is formed so as to have via plugs 202A formed in the insulating layer 200 in an embedded manner and a patterned wiring 202B formed on the insulating layer 200.

Moreover, an insulating layer 204 and a solder resist layer 205 are stacked so as to cover the conductive pattern 202. Moreover, a conductive pattern 203 connected to the conductive pattern 202 is formed such that a portion of the conductive pattern 203 is embedded in the insulating layer 204 and such that another portion of the same is exposed on the insulating layer 204. Specifically, the conductive pattern 203 is formed so as to have via plugs 203A formed in the insulating layer 204 in an embedded manner and a patterned wiring 203B formed on the insulating layer 204.

Further, a solder resist layer 205 is formed so as to have a plurality of opening sections. A plurality of electronic components 305 (e.g., semiconductor chips or passive elements such as capacitors, resistors, or inductors) are mounted on the conductive pattern 203 exposed through the plurality of opening sections by way of bumps 306.

The electronic component built-in substrate 400 of the embodiment is characterized in that the insulating layer 200, into which the electronic components 301 and the posts 201 are embedded, is formed by stacking a plurality of resin layers which include additive material for adjusting hardness in different additive ratios (hereinafter "additive ratio of the additive material" is described simply as "additive ratio").

For instance, the insulating layer 200 has a structure in which resin layers 200A, 200B, and 200C are stacked in sequence. Specifically, the insulating layer 200 is formed as a result of the resin layer 200B being formed between the resin layer 200A formed on the conductive pattern 106 (the first conductive pattern) and the resin layer 200C on which the conductive pattern 202 (the second conductive pattern) is formed. The resin layer 200B is made larger than the resin layer 200A and the resin layer 200C in terms of an additive ratio.

The insulating layer 200 has a multilayer structure in which the hard resin layer 200B having a larger additive ratio is sandwiched between the resin layers 200A and 200C that enable electroless plating and have a smaller additive ratio.

In the above structure, the resin layer 200B serving as a core of the multilayer structure of the insulating layer 200 is greater in additive ratio than the resin layers 200A and 200C. Therefore, the resin layer 200B is larger than the resin layers 200A and 200C in terms of an elastic modulus but smaller than the same in terms of a coefficient of thermal expansion. Accordingly, as a result of the resin layer 200B being formed, warpage of the insulating layer 200 and deformation of the same due to thermal expansion or contraction are prevented, and the reliability of the electronic component built-in substrate is enhanced.

The resin layers 200A and 200C formed on and below the resin layer 200B are smaller in additive ratio than the resin layer 200B. Therefore, the resin layers 200A and 200C are smaller than the resin layer 200B in terms of the elastic modulus but greater than the same in terms of the coefficient of thermal expansion. The resin layers 200A and 200C enable electroless plating, and for resin layers 200A and 200C, formation of the conductive posts and the conductive pattern is facilitated by the semi-additive method employing electroless plating and electrolytic plating in combination.

For instance, at the time of formation of the insulating layer 200 into which the electronic components 301 are to be embedded, the resin layer 200A having a small additive ratio is thinly formed. As a result, the conductive posts 201 can be formed on the resin layer 200A by means of the semi-additive method.

Next, the resin layer 200B, into which the posts 201 are to be embedded and which has a large additive ratio, is thickly formed on the resin layer 200A. The resin layer 200B has the function of preventing warpage or deformation of the entire insulating layer 200. Consequently, occurrence of breakage of the posts 201 is prevented, which in turn enhances the reliability of the electrical connection of the posts 201.

The resin layer 200C having a small additive ratio is thinly formed on the resin layer 200B. As a result, formation of the conductive pattern 202 to be connected to the posts 201 on the resin layer 200C is enabled by the semi-additive method.

For instance, a silica-based substance (containing $SiO_2$ as the principal ingredient) called a filler is used as the additive material. However, the additive material is not limited to the filler, and various substances may also be used. For instance, there can also be used a filler including alumina ($Al_2O_3$) as the principal ingredient or a filler including, as the principal ingredient, a resin which differs from the resin constituting the insulating layer in terms of a characteristic such as an elastic modulus. Glass cloth fibers (including $SiO_2$ as the principal ingredient) may also be used as the additive material.

The resin layer 200A is formed so as to cover the electronic components 301 (e.g., semiconductor chips formed by use of silicon). Hence, the resin layer 200A exhibiting superior adhesion to silicon is preferable. It is preferred that the additive ratio of the resin layer 200A is greater than the additive ratio of the resin layer 200C to such an extent that electroless plating is enabled and that the adhesion to silicon becomes appropriate.

The coefficient of thermal expansion of the substrate is reduced by using glass cloth fibers as the additive material of the resin layer 200A, whereby adhesion between silicon and the insulating layer 200A is enhanced. Therefore, glass cloth fibers are preferably included as the additive material of the insulating layer 200A.

In the insulating layer 200, the resin layer 200B is preferably formed so as to become thicker than the resin layers 200A and 200C. In this case, warpage and deformation of the insulating layer 200 can be prevented effectively.

For instance, the followings are preferable as an example configuration of the insulating layer 200. Numerals provided below are mere examples, and the present invention is not limited to them. The resin layer 200A is formed from an epoxy resin so as to have an additive ratio of about 40 to 60% (glass cloth fibers), an elastic modulus of about 10 to 15 GPa, and a thermal expansion coefficient of about 15 to 30 ppm.

The resin layer 200B is formed from an epoxy resin so as to have a thickness of 100 to 150 µm, an additive ratio of about 80 to 90% (a silica-based filler), an elastic modulus of about 15 to 20 GPa, and a thermal expansion coefficient of about 7 to 12 ppm.

The resin layer 200C is formed from an epoxy resin so as to have a thickness of 30 to 40 µm, an additive ratio of about 20 to 35% (a silica-based filler), an elastic modulus of about 2 to 5 GPa, and a thermal expansion coefficient of about 30 to 50 ppm.

An example method for manufacturing the electronic component built-in substrate 400 will now be described by reference to FIGS. 2A to 2O. In the drawings, the previously-described elements are assigned the same reference numerals, and it may be the case where their repeated explanations are omitted.

In a process shown in FIG. 2A, there is prepared the wiring board 100 which has already been described by reference to FIG. 1 and in which the core substrate 101, the via plugs 102, the conductive patterns 104, 105, 106, 109, 110, and 111, the insulating layer 103 and 108, and the solder resist layers 107 and 112 are formed. A plurality of opening sections 107A have been formed in the solder resist layer 107 in advance, thereby letting portions of the conductive pattern 106 exposed.

The wiring board 100 can be manufactured by means of a known build-up method. Moreover, the substrate is not limited to a build-up substrate, and another printed wiring board may also be used.

Figure 2B:
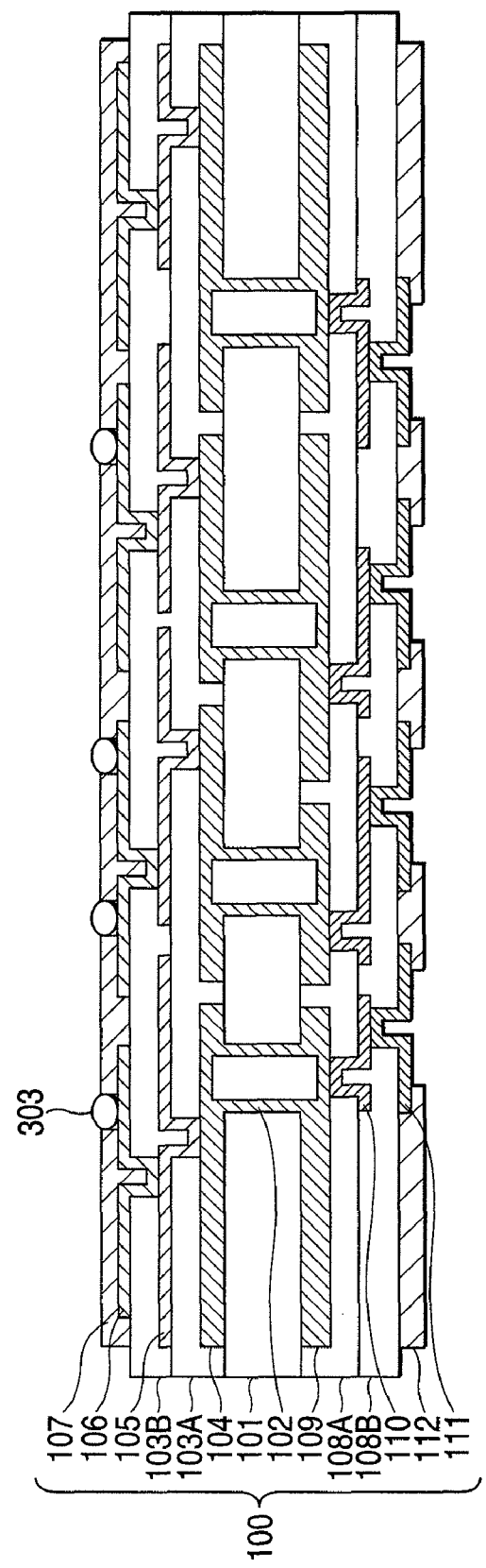
FIG. 2B is a view showing a method for manufacturing the substrate with built-in electronic components of the first embodiment (part 2)

In a process shown in FIG. 2B, the preliminary solder layer (solder bumps) 303 is formed on the portions of the conductive pattern 106 exposed through the opening sections 107A.

Next, in a process shown in FIG. 2C, the electronic components 301 on which bumps 302 are formed from; e.g., Au, are connected to the conductive pattern 106 by flip-chip bonding. In this case, the bumps 302 are electrically connected to the conductive pattern 106 by way of the solder layer 303 by use of a method; e.g., a heating method, an ultrasonic method, or the like. Moreover, the underfill 304 formed from a liquid resin material is filled between the electronic components 301 and the solder resist layer 107. In this case, electronic components; for example, capacitors, resistors, or inductors, may also be mounted so as to be connected to the conductive pattern 106.

In a process shown in FIG. 2D, opening sections 107B are formed in the solder resist layer 107 by use of; for example, a $CO_2$ laser or a UV-YAG laser, thereby uncovering portions of the conductive pattern 106. In the process shown in FIG. 2A, the opening sections 107B may also be formed concurrently with the opening sections 107A.

In a process shown in FIG. 2E, the previously-described resin layer 200A is formed so as to cover the solder resist layer 107 and the electronic components 301 by means of; e.g., lamination of a resin film or application of a liquid resin. The additive ratio of the resin layer 200A is preferably selected so as to enable processing pertaining to the semi-additive method (electroless plating) in a subsequent process and enhance adhesion of the resin layer 200A to the electronic components 301. Using a filler as the additive material is also possible, but use of glass cloth fibers is preferable because the adhesion of the resin layer 200A to the electronic components 301 becomes enhanced.

The additive ratio of the resin layer 200A formed in this process becomes smaller than the additive ratio of the resin layer 200B formed in a subsequent process but larger than the additive ratio of the resin layer 200C. As a result, the elastic modulus of the resin layer 200A becomes smaller than the elastic modulus of the resin layer 200B but greater than the elastic modulus of the resin layer 200C. Further, the coefficient of thermal expansion of the resin layer 200A becomes greater than the coefficient of thermal expansion of the resin layer 200B but smaller than the coefficient of thermal expansion of the resin layer 200C.

In a process shown in FIG. 2F, opening sections 107C are formed in the resin layer 200A by use of; for example, a $CO_2$ laser or a UV-YAG laser, thereby letting portions of the conductive pattern 106 exposed. Opening sections 107C penetrating through the solder resist layer 107 and the resin layer 200A may also be formed in the process shown in FIG. 2F without forming the opening sections 107B in the previously-described process shown in FIG. 2D.

In a process shown in FIG. 2G, the substrate is subjected to chemical processing (a desmear treatment) for roughening the surface of the resin layer 200A in order to facilitate electroless plating. Since the electronic components 301 are protected by the resin layer 200A at the time of wet processing, influence of the damage on the electronic components 301, which would be inflicted by; for example, a permanganate-based chemical, is prevented. Specifically, the resin layer 200A also has the function of protecting the electronic components 301.

A seed layer 201a is formed, by means of electroless plating, from Cu on the surface of the resin layer 200A roughened by the desmear treatment. In this process, the additive ratio of the resin layer 200A is selected to such an extent that electroless plating is practicable on the resin layer 200A. Further, the resin layer 200A is subjected to the desmear treatment, whereby the seed layer 201a can be formed easily. In this process, since the electronic components 301 are coated with the resin layer 200A, exposure of the electronic components 301 to a plating liquid is prevented.

Figure 2H:
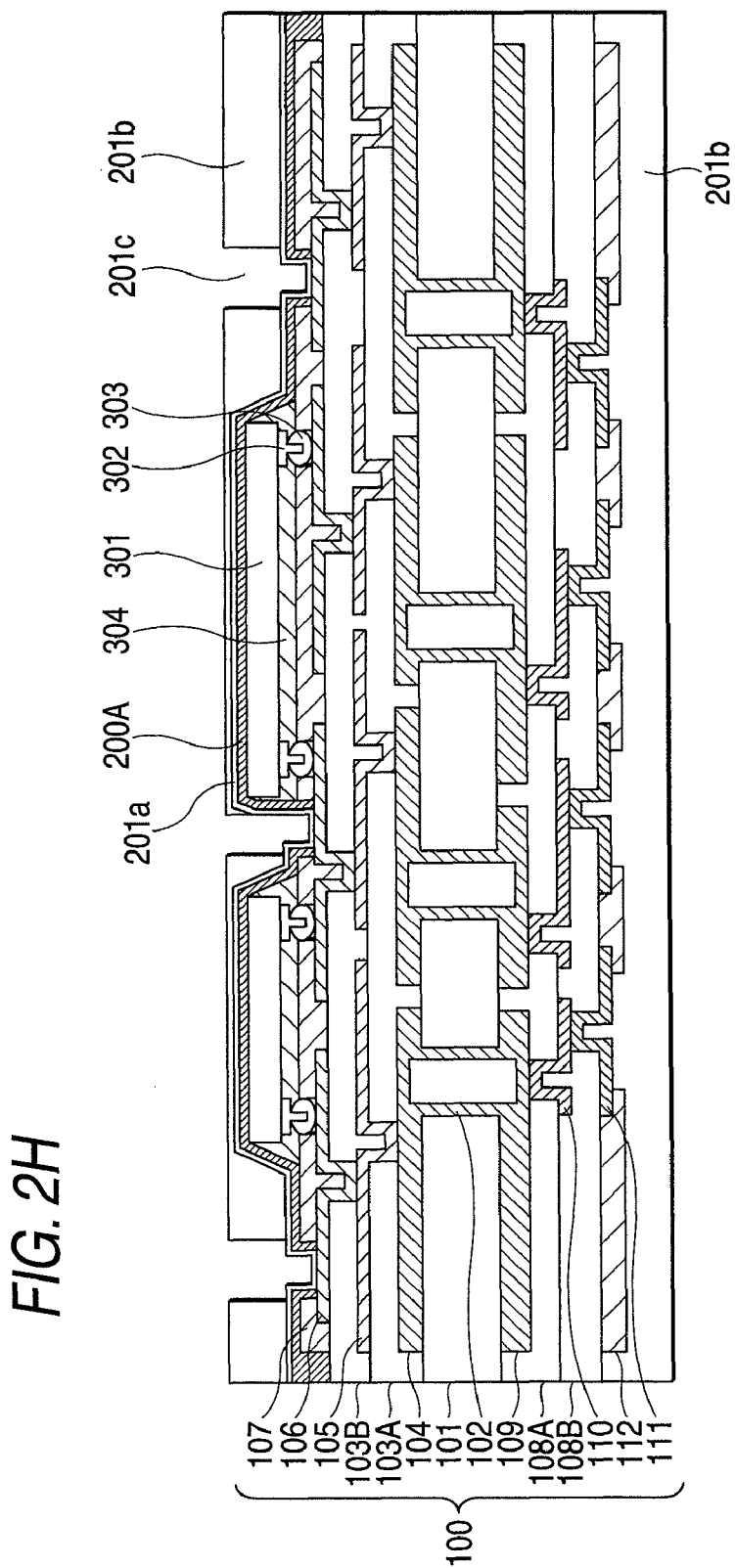
FIG. 2H is a view showing a method for manufacturing the substrate with built-in electronic components of the first embodiment (part 8)
Figure 21:
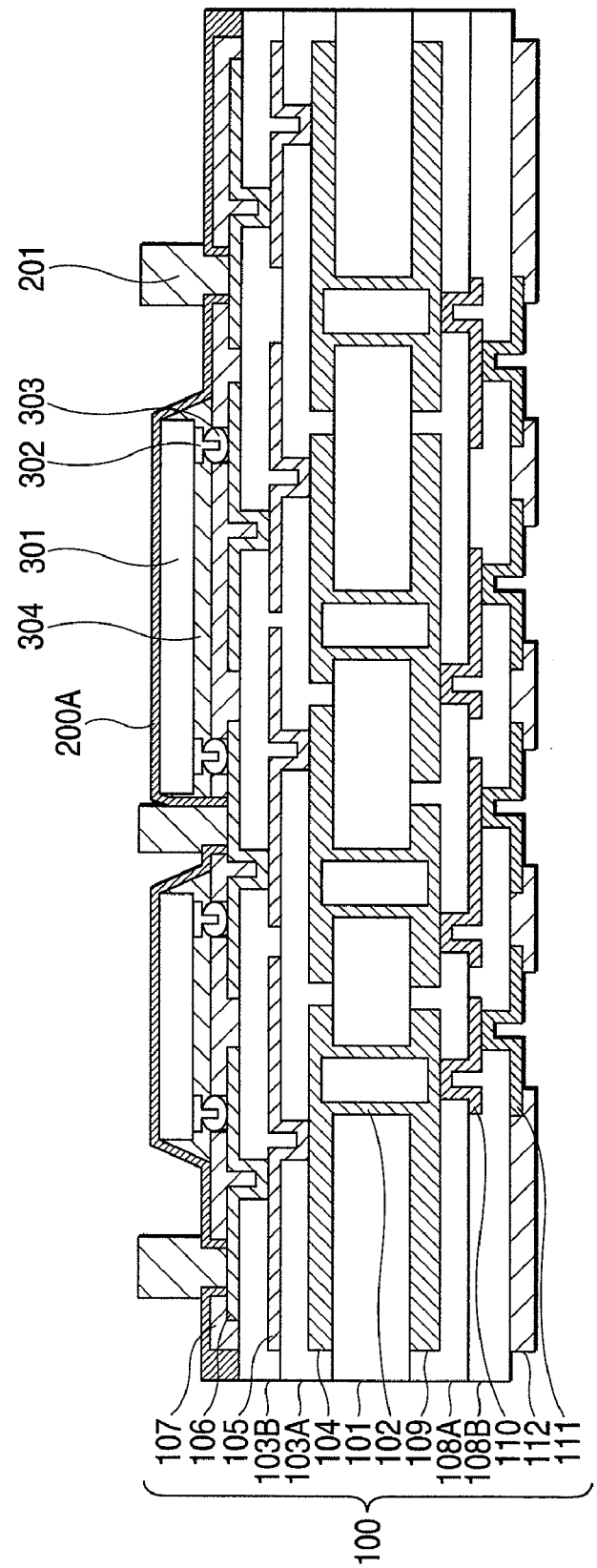

Next, in a process shown in FIG. 2H, a resist layer is formed by means of lamination of a resin film or application of a liquid resin. The resist layer is patterned by means of photolithography, thereby forming a resist pattern 201b having opening sections 201c corresponding to the opening sections 107C.

In a process shown in FIG. 2I, the posts 201 are formed from Cu so as to fill the opening sections 201c by means of electrolytic plating (the semi-additive method) during which the previously-formed seed layer 201a is taken as a feeding layer. The posts 201 formed in this process are characterized by having higher hardness and higher reliability of connection than that of the via plugs formed from interior wall surfaces of related-art via holes through conformal plating and growth.

The resist pattern 201b is removed after formation of the posts 201, and the exposed seed layer 201a is removed by etching.

In a process shown in FIG. 2J, the previously-described resin layer 200B is formed on the resin layer 200A by means of; e.g., lamination of a resin film or application of a liquid resin. The additive ratio of the resin layer 200B is preferably made large so as to prevent warpage or deformation of the insulating layer 200. Further, a silica-based filler can be used as the additive material.

The resin layer 200B formed in this process is made greater than the resin layer 200C formed in a subsequent process and the resin layer 200A in terms of an additive ratio. The resin layer 200B becomes greater than the resin layers 200A and 200C in terms of an elastic modulus but smaller than the resin layers 200A and 200C in terms of a coefficient of thermal expansion. The resin layer 200B is preferably greater than the resin layers 200A and 200C in terms of a thickness. The surface of the resin layer 200B may also be planarized by means of grinding, as necessary, to thus let the extremities of the respective posts 201 exposed.

In a process shown in FIG. 2K, the previously-described resin layer 200C is formed on the resin layer 200B by means of; for example, lamination of a resin film or application of a liquid resin. The additive ratio of the resin layer 200C is preferably selected to such an extent that processing pertaining to the semi-additive method (electroless plating) becomes practicable in a subsequent process. Further, a silica-based filler can be used as the additive material.

The resin layer 200C formed in this process is made smaller than the additive ratio of the resin layer 200A and 200B in terms of a additive ratio. Further, the resin layer 200C becomes smaller than the resin layers 200A and 200B in terms of an elastic modulus but greater than the resin layers 200A and 200B in terms of a coefficient of thermal expansion.

Specifically, the resin layer 200C formed in this process is formed in such a way that electroless plating intended for processing pertaining to the semi-additive method becomes easy to perform.

Next, opening sections 200d are formed in the resin layer 200C by use of; for example, a $CO_2$ laser or a UV-YAG laser, to thus let portions of extremities of the posts 201 exposed.

Next, in a process shown in FIG. 2L, desmear processing for roughening the surface of the resin layer 200C is performed, as necessary. A seed layer 202c consisting of Cu is formed on the surface of the roughened resin layer 200C. In this process, the additive ratio of the resin layer 200C is selected to such an extent that electroless plating is practicable. Further, the seed layer 202c can be formed easily by means of desmear processing.

Figure 2M:
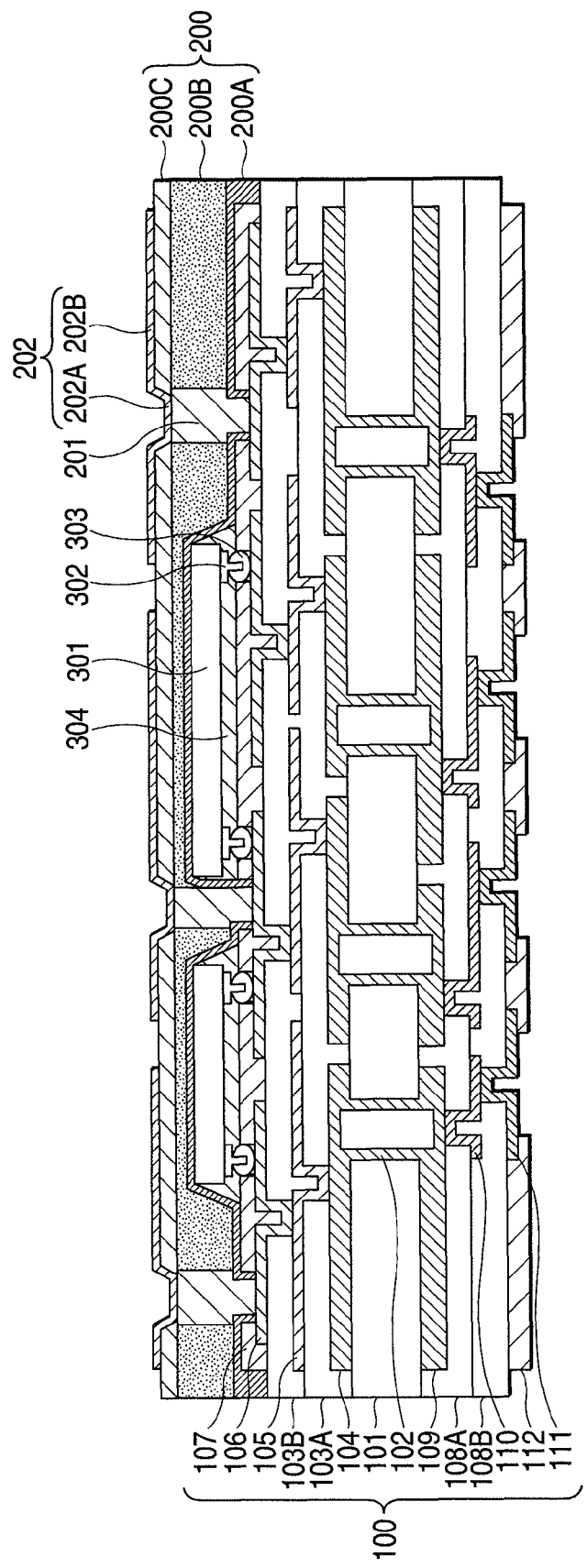
FIG. 2M is a view showing a method for manufacturing the substrate with built-in electronic components of the first embodiment (part 13)

In a process shown in FIG. 2M, the conductive pattern 202 is formed from the via plugs 202A and the patterned wiring 202B by means of electrolytic plating (the semi-additive method) during which the previously-formed seed layer 202c is taken as a feeding layer.

At the time of formation of the conductive pattern 202, a resist pattern is formed on the seed layer 202c by means of photolithography. Next, the via plugs 202A to be connected to the posts 201 and the patterned wiring 202B to be connected to the via plugs 202A are formed by means of electrolytic plating during which the resist pattern is taken as a mask. The resist pattern is removed after electrolytic plating, and the resultantly-exposed seed layer 202c is removed by etching, thereby creating a structure shown in FIG. 2M.

In a process shown in FIG. 2N, processing pertaining to processes shown in FIGS. 2L to 2M is iterated, thereby forming the insulating layer 204 covering the conductive pattern 202 and the conductive pattern 203 which is to be connected to the conductive pattern 202 and which is formed from the via plugs 203A and the patterned wiring 203B. Even in this process, as in the processes shown in FIGS. 2L to 2M, there can be employed the semi-additive method that is a combination of formation of a seed layer through electroless plating with electrolytic plating during which the seed layer is taken as a feeding layer.

Moreover, in addition to the insulating layer 204, the insulating layer 113, which is to be stacked on the solder resist layer 112 and which has opening sections corresponding to the opening sections of the solder resist 112, may also be formed.

In a process shown in FIG. 2O, the solder resist 205 having opening sections 205A is formed on the insulating layer 204. The opening sections 205A are formed such that portions of the conductive pattern 203 become exposed.

Moreover, in addition to the solder resist layer 205, the solder resist layer 114, which is to be stacked on the insulating layer 113 and which has opening sections corresponding to the opening sections of the insulating layer 113, may also be formed.

Further, as shown in FIG. 1, electronic components 305 are connected to the conductive pattern 203 via bumps 306 formed from solder by flip-chip bonding. The solder bumps 115 are formed in the exposed conductive pattern 111, as necessary, thereby enabling manufacture of the electronic component built-in substrate 400 shown in FIG. 1

In actual manufacture of an electronic component built-in substrate, a plurality of electronic component built-in substrate (i.e., the structure shown diagrammatically in FIG. 1) are formed by use of a single substrate, and the substrate is sliced into pieces in a subsequent process. In the embodiment (shown in FIGS. 2A to 2O), a substrate, from which a plurality of electronic component built-in substrates are to be formed, is diagrammatically illustrated and described by means of taking, by way of example, a region where one electronic component built-in substrate is to be formed.

The above manufacturing method is characterized in that the insulating layer 200 into which the electronic components 301 are embedded is formed by sequentially stacking the plurality of resin layers 200A, 200B, and 200C that include additive material for adjusting hardness in different additive ratios. Therefore, an electronic component built-in substrate, which prevents influence of warpage or deformation due to a heat cycle and which exhibits superior reliability, can be manufactured by use of the semi-additive method (including electroless plating).

The present invention has been described by reference to the preferred embodiment. However, the present invention is not limited to the above specific embodiment and susceptible to various modifications or alterations within the scope of the gist described in the appended claims.

For instance, the wiring board on which the electronic components 301 are to be mounted is not limited to a build-up wiring board, and another printed wiring board can also be used. Moreover, the number of wiring layers formed above the electronic components 301 can be changed variously.

According to the present invention, there can be provided an electronic component built-in substrate which exhibits superior reliability and into which electronic components are embedded by means of insulating layers, as well as a method for manufacturing the electronic component built-in substrate.

What is claimed is:

1. A substrate with a built-in electronic component, comprising:
    a substrate on which a first conductive pattern is formed;
    an electronic component mounted on the first conductive pattern;
    an insulating layer covering the electronic component and formed by stacking a plurality of resin layers, each resin layer including an additive material in a different additive ratio;
    a second conductive pattern formed on the insulating layer; and
    a conductive columnar electrode for connecting the first conductive pattern to the second conductive pattern, wherein
    the insulating layer includes a first resin layer formed on the first conductive pattern, a third resin layer on which the second conductive layer is formed, and a second resin layer formed between the first resin layer and the third resin layer,
    the second resin layer is thicker than the first resin layer and the third resin layer, and
    the second resin layer is greater than the first resin layer and the third resin layer in terms of an additive ratio of the additive material.

2. The substrate with a built-in electronic component according to claim 1, wherein the additive material includes $SiO_2$ as a principal ingredient.

3. The substrate with a built-in electronic component according to claim 1, wherein the first resin layer is greater than the third resin layer in terms of a additive ratio of the additive material.

4. The substrate with a built-in electronic component according to claim 1, wherein the additive material added to the first resin material includes glass cloth fibers.

5. The substrate with a built-in electronic component according to claim 1, wherein the first resin layer has an additive ratio of 40 to 60%, an elastic modulus of 10 to 15 GPa, and a thermal expansion coefficient of 15 to 30 ppm.

6. The substrate with a built-in electronic component according to claim 1, wherein the second resin layer has an additive ratio of 80 to 90%, an elastic modulus of 15 to 20 GPa, and a thermal expansion coefficient of 7 to 12 ppm.

7. The substrate with a built-in electronic component according to claim 1, wherein the third resin layer has an additive ratio of 20 to 35%, an elastic modulus of 2 to 5 GPa, and a thermal expansion coefficient of 30 to 50 ppm.

8. The substrate with a built-in electronic component according to claim 1, wherein
    the first resin layer has an additive ratio of 40 to 60%, an elastic modulus of 10 to 15 GPa, and a thermal expansion coefficient of 15 to 30 ppm,
    the second resin layer has an additive ratio of 80 to 90%, an elastic modulus of 15 to 20 GPa, and a thermal expansion coefficient of 7 to 12 ppm, and
    the third resin layer has an additive ratio of 20 to 35%, an elastic modulus of 2 to 5 GPa, and a thermal expansion coefficient of 30 to 50 ppm.

* * * * *